United States Patent
Smith

(10) Patent No.: US 10,643,440 B2
(45) Date of Patent: May 5, 2020

(54) DOOR/WINDOW SENSOR

(71) Applicant: Honeywell International Inc., Morristown, NJ (US)

(72) Inventor: Richard Alan Smith, Sunriver, OR (US)

(73) Assignee: ADEMCO INC., Golden Valley, MN (US)

( * ) Notice: Subject to any disclaimer, the term of this patent is extended or adjusted under 35 U.S.C. 154(b) by 0 days.

(21) Appl. No.: 15/861,214

(22) Filed: Jan. 3, 2018

(65) Prior Publication Data

US 2019/0206206 A1 Jul. 4, 2019

(51) Int. Cl.
| | |
|---|---|
| *G08B 13/08* | (2006.01) |
| *G08B 21/18* | (2006.01) |
| *G06K 19/077* | (2006.01) |
| *G08B 29/04* | (2006.01) |
| *G01R 33/02* | (2006.01) |
| *G01R 33/028* | (2006.01) |

(52) U.S. Cl.
CPC ......... *G08B 13/08* (2013.01); *G01R 33/0206* (2013.01); *G01R 33/0286* (2013.01); *G06K 19/07758* (2013.01); *G08B 21/18* (2013.01); *G08B 29/046* (2013.01)

(58) Field of Classification Search
CPC ...... G08B 13/08; G08B 21/18; G08B 29/046; G01R 33/0206; G06K 19/07758
USPC .................................................. 340/435, 547
See application file for complete search history.

(56) References Cited

U.S. PATENT DOCUMENTS

| | | | |
|---|---|---|---|
| 4,359,646 A | 11/1982 | Mejia et al. | |
| 6,310,549 B1 | 10/2001 | Loftin et al. | |
| 8,970,373 B2 | 3/2015 | Buckley et al. | |
| 8,988,225 B2 | 3/2015 | Smith | |
| 9,361,773 B2 | 6/2016 | Smith | |
| 9,482,032 B2 | 11/2016 | Bedoian et al. | |
| 9,576,449 B2 | 2/2017 | Smith | |
| 2009/0027199 A1* | 1/2009 | DiPoala | G08B 13/08 340/547 |
| 2016/0165323 A1 | 6/2016 | Hollis | |
| 2016/0187368 A1 | 6/2016 | Modi et al. | |
| 2016/0249281 A1 | 8/2016 | Sahni | |
| 2016/0275764 A1 | 9/2016 | Smith | |
| 2017/0131356 A1* | 5/2017 | Boury | H01H 36/0073 |
| 2017/0226774 A1* | 8/2017 | Goldenson | G01R 33/0206 |

(Continued)

OTHER PUBLICATIONS

EP Search Report from corresponding EP patent application 18215999.6, dated Mar. 12, 2019.

*Primary Examiner* — Joseph H Feild
*Assistant Examiner* — Sharmin Akhter
(74) *Attorney, Agent, or Firm* — Husch Blackwell LLP

(57) ABSTRACT

Systems and methods for a door or window contact sensor are provided. Some systems can include a three-dimensional (3D) microelectromechanical system (MEMS) magnetic sensor, a programmable processor, and executable control software stored on a non-transitory computer readable medium, wherein the 3D MEMS magnetic sensor can measure magnetic parameters of a magnetic field along three axes, and wherein the programmable processor and the executable control software can compare the magnetic parameters to reference values to determine whether the magnetic parameters indicate that a door or a window associated with the 3D MEMS magnetic sensor is open or closed.

19 Claims, 3 Drawing Sheets

(56) References Cited

U.S. PATENT DOCUMENTS

2017/0243456 A1    8/2017  Smith
2019/0234110 A1*  8/2019  Laporta ..................... E05B 7/00

* cited by examiner

DOOR/WINDOW SENSOR

FIELD

The present invention relates generally to security system sensors. More particularly, the present invention relates to door and window contact sensors.

BACKGROUND

Security systems are known to detect threats within a secured area, and such threats include events that represent a risk to human safety or a risk to assets.

Security systems typically include one or more security sensors that detect the threats within the secured area. For example, smoke, motion, contact, intrusion, camera, gas, and/or intrusion sensors are distributed throughout the secured area in order to detect the threats.

Known door or window contact sensors typically rely upon reed and magnet (RM) technology. Although RM technology is inexpensive, it has limitations. For example, known RM contact sensors have a limited protection distance and can be defeated by introducing another magnet in close proximity to a mounted RM contact sensor.

Some improvements to known RM contact sensors overcome these limitations but increase unit cost. Therefore, there is a need for a door or window contact sensor that overcomes the limitations discussed above without significantly increasing unit cost.

DETAILED DESCRIPTION

Figure 1:
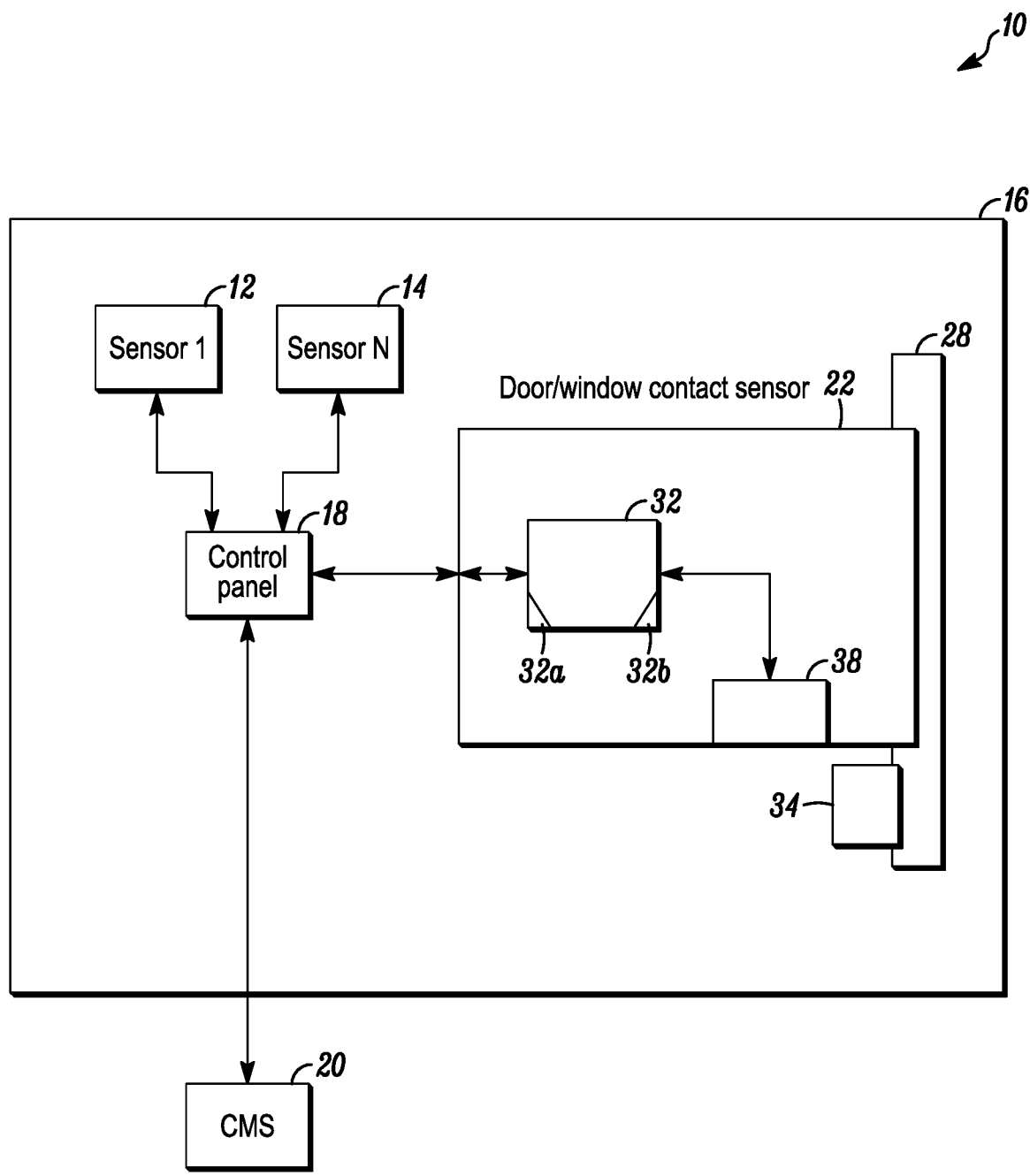
FIG. 1 is a block diagram of a system in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods for controlling a door or window contact sensor with a three dimensional (3D) microelectromechanical system (MEMS) magnetic sensor. For example, the door or window contact sensor can use the 3D MEMS magnetic sensor to detect three-dimensional movement of a door or a window associated with the door or window contact sensor.

In some embodiments, the door or window contact sensor can identify spatial and flux-line parameters (i.e. reference values) between a reference magnet and the 3D MEMS magnetic sensor during installation of the door or window contact sensor. For example, in some embodiments, the door or window contact sensor can identify the reference values responsive to powering on the door or window sensor. Furthermore, in some embodiments, during the installation of the door or window contact sensor, the door or window contact sensor can identify magnetic field strength values associated with the door or the window in an open position and in a closed position. In some embodiments, the door or window sensor and the reference magnet can be mounted on ferrous or non-ferrous materials.

FIG. 1 is a block diagram of a security system 10 in accordance with disclosed embodiments. As seen in FIG. 1, the security system 10 can include one or more security sensors 12, 14, 22 that monitor a secured area 16 for threats, and in some embodiments, the security sensors 12, 14, 22 can include contact, intrusion, camera, motion, fire, smoke, and/or gas detectors. The security sensors 12, 14, 22 can communicate with a control panel 18, and the control panel 18 can monitor for activation of one or more of the security sensors 12, 14, 22.

In some embodiments, the control panel 18 can send an alarm message to a central monitoring station 20 upon the activation of one of the security sensors 12, 14, 22, and the central monitoring station 20 may respond by summoning appropriate help. For example, if the one of the security sensors 12, 14, 22 detects a fire, then the central monitoring station 20 may summon a local fire department. Alternatively, if the one of the security sensors 12, 14, 22 detects an intrusion, then the central monitoring station 20 may summon the police.

In some embodiments, one of the security sensors 12, 14, 22 can include a door or window contact sensor 22 associated with a door or a window 28 in the secured area 16 that can detect intrusion into the secured area 16 or attempted entry into the secured area 16 through the door or the window 28. Additionally or alternatively, in some embodiments, the door or window contact sensor 22 can be associated with a valuable asset and detect movement of the valuable asset.

In any embodiment, the door or window contact sensor 22 can include control circuitry 32, which can include one or more programmable processor 32a and executable control software 32b as would be understood by one of ordinary skill in the art. The executable control software 32b can be stored on a transitory or non-transitory computer readable medium, including, but not limited to local computer memory, RAM, optical storage media, magnetic storage media, and the like. In some embodiments, the control circuitry 32, the programmable processor 32a, and the executable control software 32b can execute and control some of the methods disclosed herein.

In some embodiments, the door or window contact sensor 22 can include a magnetic sensor 38 that can sense magnetic parameters (e.g. magnetic field vectors, magnetic flux density) of a magnetic field generated by a reference magnet 34. For example, in some embodiments, the reference magnet 34 can be recessed, positioned, mounted, or included within or on a surface of a stationary portion of the door or the window 28 (e.g. a hinge or a frame of the door or the window 28), and the door or window contact sensor 22, including the control circuitry 32, the programmable processor 32a, the executable control software 32b, and the magnetic sensor 38, can be recessed, positioned, mounted, or included within or on a surface of a moving portion of the door or the window 28 (e.g. a sliding door, a swinging door, a rotating window, or a sliding window). Alternatively, in some embodiments, the reference magnet 34 can be recessed, positioned, mounted, or included within or on the surface of the moving portion of the door or the window 28, and the door or window contact sensor 22, including the control circuitry 32, the programmable processor 32a, the executable control software 32b, and the magnetic sensor 38, can be recessed, positioned, mounted, or included within or on the surface of the stationary portion of the door or the window 28. In any embodiment, the magnetic sensor 28 can sense the magnetic parameters of the magnetic field generated by the reference magnet 34 to detect relative movement between the reference magnet 34 and the magnetic sensor 28

In some embodiments, the magnetic sensor 38 can include a 3D MEMS sensor that can detect changes in the magnetic parameters along three axes (x, y, z), thereby allowing the magnetic sensor 38 to detect the relative movement in three dimensions. For example, in some embodiments, the 3D MEMS sensor can detect vector data and magnetic flux magnitude data of the magnetic field along the three axes to determine the relative movement. Furthermore, in some embodiments, the 3D MEMS sensor can use the magnetic flux magnitude data to detect whether a second magnet has been introduced in close proximity to the magnetic sensor 38 as part of an attempt to defeat.

Figure 2:
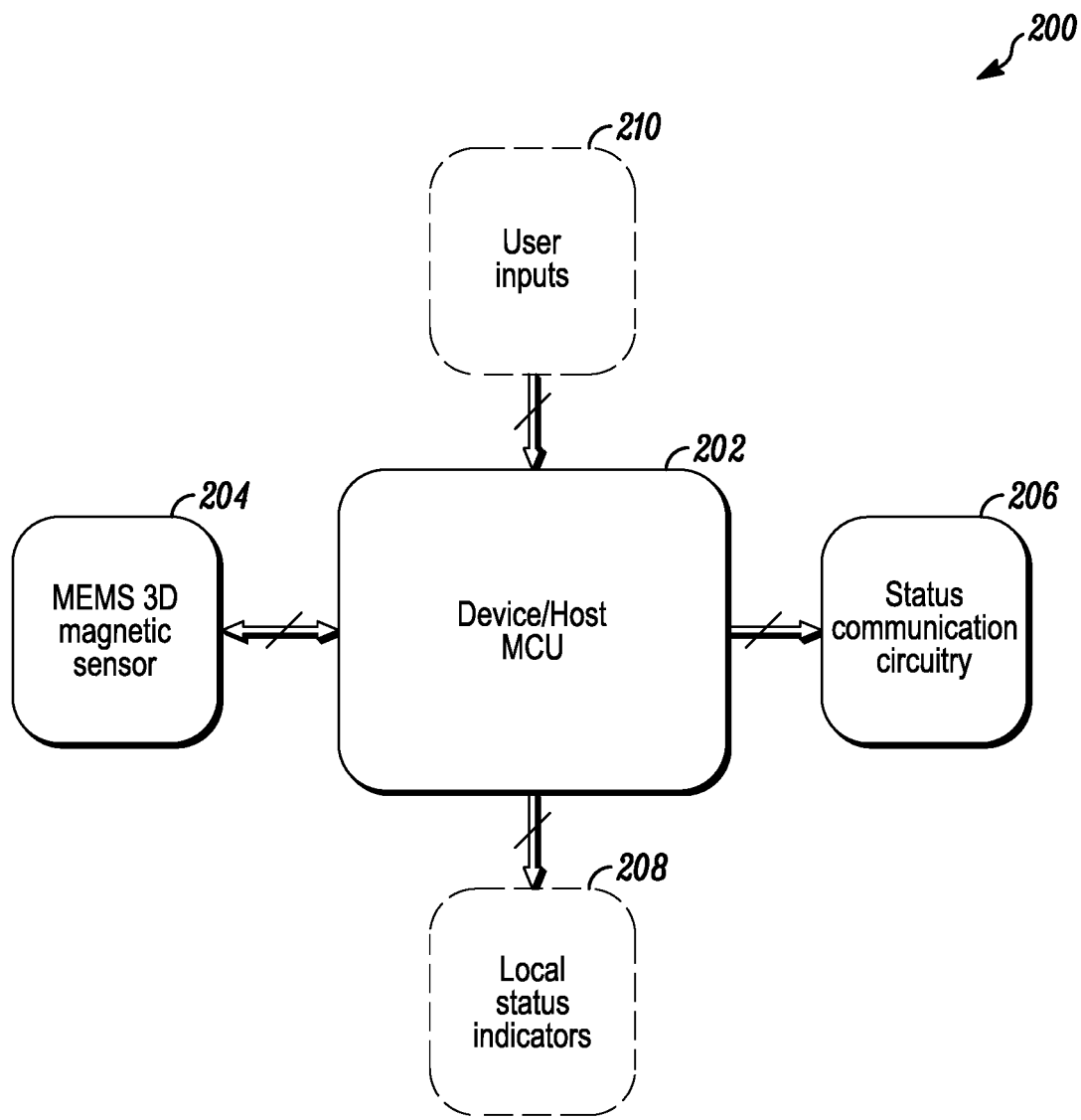
FIG. 2 is a block diagram of a door or window contact sensor in accordance with disclosed embodiments.

FIG. 2 is a block diagram of a door or window contact sensor 200 (e.g. the door or window contact sensor 22) in accordance with disclosed embodiments. As seen in FIG. 2, the door or window contact sensor 200 can include a microcontroller 202 (e.g. the programmable processor 32a), a 3D MEMS sensor 204 (e.g. the magnetic sensor 38), status communication circuitry 206, and status indicators 208. The microcontroller 202 can execute control software (e.g. the executable control software 32b) to process signals from the 3D MEMS sensor 204 to determine relative movement of the door or window contact sensor 200 or to detect an intrusion by comparing the relative movement to reference values, for example, by applying a discrimination algorithm.

In some embodiments, the 3D MEMS sensor 204 can detect the relative movement along three axes by sensing a magnetic field generated by a reference magnet (e.g. the reference magnet 28). Movement of either the door or window contact sensor 200 relative to the reference magnet or the reference magnet relative to the door or window contact sensor 200 can change magnetic parameters detected by the 3D MEMS sensor 204 (e.g. magnetic flux magnitude or magnetic field vectors), which can the 3D MEMS sensor 204 can use to detect the relative movement along the three axes, detect partial or complete closure of a door or a window associated with the door or window contact sensor 200, detect a previously identified open position of the door or the window, detect another magnetic field as part of an attempt to defeat, detect movement and a direction of the movement (e.g. opening the door or the window, closing the door or the window), detect boundary limits, or detect an orientation of the door or window contact sensor 200 relative to the reference magnet (e.g. at-rest orientation, changing orientation).

In some embodiments, the 3D MEMS sensor 204 can transmit movement data (e.g. the vector data and the magnetic flux magnitude data) to the microcontroller 202, and the microcontroller 202 can analyze, validate, or compare the movement data to movement reference values identified and saved during installation of the door or window contact sensor 200. For example, the microcontroller 202 can compare the movement data to the movement reference values to determine whether the movement data corresponds to an expected value or whether the movement data suggests that the door or the window associated with the door or window contact sensor 200 is being broken or forced open.

Additionally or alternatively, in some embodiments, the 3D MEMS sensor 204 can sample the magnetic flux magnitude, and the microcontroller 202 can compare the magnetic flux magnitude to a magnetic flux reference value identified during the installation of the door or window contact sensor 200. Furthermore, the microcontroller 202 can determine whether another magnetic field has been introduced as part of an attempt to defeat the door or window contact sensor 200 when the magnetic flux magnitude is greater than an expected value. In some embodiments, a sampling period for sampling the magnetic flux magnitude can be optimized for performance or power consumption considerations.

In some embodiments, the status communication circuitry 206 can wirelessly transmit a status signal to a control panel (e.g. the control panel 18), and the status signal can identify a status of an ambient environment of the door or window contact sensor 200, including an alarm situation, the door or the window being open, or the door or the window being closed. For example, when the microprocessor 202 determines that the movement data varies from the movement reference values by more than a predetermined amount or the magnetic flux magnitude varies from the magnetic flux reference value by more than the predetermined amount, the microprocessor 202 can instruct the status communication circuitry 206 to identify the alarm situation in the status signal transmitted to the control panel.

In some embodiments, the local status indicators 208 can visually identify the status of the ambient environment of the door or window contact sensor 200. For example, in some embodiments, the local status indicators 208 can include one or more LEDs or a display device located on an exterior of the door or window contact sensor 200

In some embodiments, the door or window contact sensor 200 can receive user input via a user input device 210. For example, the user input can identify the reference values, instruct the door or window contact sensor 200 when to measure the reference values, identify the door or the window being open, identify the door or the window being closed, or identify a time of the installation of the door or window contact sensor 200. Additionally or alternatively, in some embodiments, the door or window contact sensor 200 can measure the reference values absent any user input.

In some embodiments, the door or window contact sensor 200 can also include an accelerometer, and the microprocessor 202 can compare accelerometer data to accelerometer reference values to further analyze or validate the movement data or the magnetic flux magnitude data.

Figure 3:
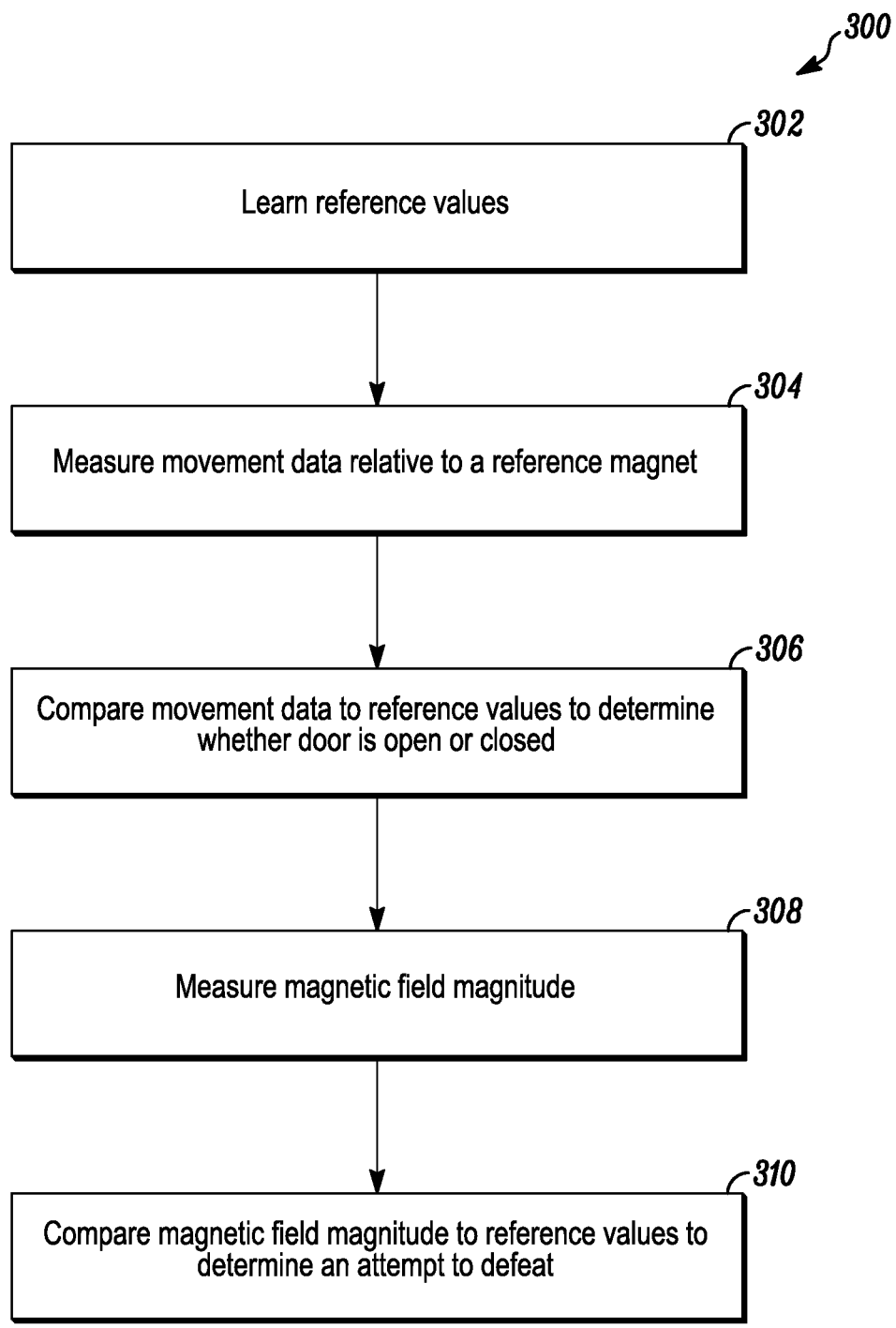
FIG. 3 is a flow diagram of a method in accordance with disclosed embodiments.

FIG. 3 is a flow diagram of a method 300 for controlling a door or window contact sensor (e.g. the door or window sensor 200) in accordance with disclosed embodiments. As seen in FIG. 3, the method 300 can include a processor (e.g. microcontroller 202) and a magnetic sensor (e.g. the 3D MEMS sensor 204) detecting and saving movement reference values and a magnetic field reference value as in 302, the magnetic sensor measuring movement data along three axes as in 304, and the processor comparing the movement data to the movement reference values to determine whether the movement data indicates that a door or a window associated with the door or window contact sensor is open or closed as in 306. Furthermore, the method 300 can include the magnetic sensor measuring a magnetic flux magnitude as in 308, and the processor comparing the magnetic flux magnitude to the magnetic flux reference value to determine whether the magnetic flux magnitude indicates an attempt to defeat as in 310.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. A system comprising:
   a three-dimensional (3D) microelectromechanical system (MEMS) magnetic sensor;
   a programmable processor; and
   executable control software stored on a non-transitory computer readable medium,
   wherein the 3D MEMS magnetic sensor measures magnetic flux magnitude parameters of a magnetic field along three axes,
   wherein the 3D MEMS magnetic sensor measures magnetic vector parameters of the magnetic field along three axes,
   wherein the programmable processor and the executable control software compare the magnetic flux magnitude parameters and the magnetic vector parameters to movement reference values to determine whether the magnetic flux magnitude parameters and the magnetic vector parameters indicate relative movement of a door or a window associated with the 3D MEMS magnetic sensor, and
   wherein the 3D MEMS magnetic sensor measures the movement reference values responsive to a powering on event.

2. The system of claim 1 wherein the movement reference values include first reference values and second reference values.

3. The system of claim 2 wherein the programmable processor and the executable control software identify the first reference values of the magnetic field along the three axes for an open position of the door or the window, and wherein the programmable processor and the executable control software identify the second reference values of the magnetic field along the three axes for a closed position of the door or the window.

4. The system of claim 1 further comprising:
   a reference magnet,
   wherein the reference magnet generates the magnetic field.

5. The system of claim 4 wherein the reference magnet is mounted on a stationary portion of the door or the window, and wherein the 3D MEMS magnetic sensor is mounted on a moving portion of the door or the window.

6. The system of claim 4 wherein the reference magnet is mounted on a moving portion of the door or the window, and wherein the 3D MEMS magnetic sensor is mounted on a stationary portion of the door or the window.

7. The system of claim 1 further comprising:
   status communication circuitry that reports an alarm status to a control panel of a security system protecting a secured area in which the door or the window is located.

8. A system comprising:
   a three-dimensional (3D) microelectromechanical system (MEMS) magnetic sensor;
   a programmable processor; and
   executable control software stored on a non-transitory computer readable medium,
   wherein the 3D MEMS magnetic sensor measures magnetic flux magnitude parameters of a magnetic field along three axes,
   wherein the 3D MEMS magnetic sensor measures magnetic vector parameters of the magnetic field along three axes,
   wherein the programmable processor and the executable control software compare the magnetic flux magnitude parameters to movement reference values and the magnetic vector parameters to determine whether the magnetic flux magnitudes indicate an attempt to defeat, and
   wherein the 3D MEMS magnetic sensor measures the movement reference values responsive to a powering on event.

9. The system of claim 8 wherein the programmable processor and the executable control software identify the movement reference values along the three axes.

10. The system of claim 8 further comprising:
    a reference magnet,
    wherein the reference magnet generates the magnetic field.

11. The system of claim 10 wherein the reference magnet is mounted on a stationary portion of a door or a window, and wherein the 3D MEMS magnetic sensor is mounted on a moving portion of the door or the window.

12. The system of claim 10 wherein the reference magnet is mounted on a moving portion of a door or a window, and wherein the 3D MEMS magnetic sensor is mounted on a stationary portion of the door or the window.

13. The system of claim 8 wherein the programmable processor and the executable control software detect the attempt to defeat when one or more of the magnetic flux magnitude parameters along one or more of the three axes differs from one or more of the movement reference values.

14. The system of claim 8 further comprising:
    status communication circuitry that reports an alarm status to a control panel of a security system protecting a secured area in which the 3D MEMS magnetic sensor is located.

15. A method comprising:
    measuring movement reference values of a magnetic field along three axes at a three-dimensional (3D) microelectromechanical (MEMS) magnetic sensor responsive to a powering on event;
    after measuring the magnetic reference values, measuring magnetic flux magnitude parameters of the magnetic field along the three axes at the 3D MEMS magnetic sensor;
    after measuring the magnetic reference values, measuring magnetic vector parameters of the magnetic field along the three axes at the 3D MEMS magnetic sensor; and
    comparing the magnetic flux magnitude parameters and the magnetic vector parameters to the movement reference values to determine whether the magnetic flux magnitude parameters and the magnetic vector parameters indicate relative movement of a door or a window associated with the 3D MEMS magnetic sensor.

16. The method of claim 15 wherein the movement reference values include first reference values and second reference values.

17. The method of claim 16 further comprising:
    identifying the first reference values of the magnetic field along the three axes for an open position of the door or the window; and
    identifying the second reference values of the magnetic field along the three axes for a closed position of the door or the window.

18. The method of claim 17 further comprising:
comparing the magnetic flux magnitude parameters to the movement reference values to determine whether the magnetic flux magnitude parameters indicate an attempt to defeat.

19. The method of claim 15 wherein the magnetic field is generated by a reference magnet.

* * * * *